(12) United States Patent
Shirota

(10) Patent No.: US 12,362,736 B2
(45) Date of Patent: Jul. 15, 2025

(54) CLOCK FREQUENCY ADJUSTING CIRCUIT AND METHOD FOR ADJUSTING CLOCK FREQUENCY

(71) Applicant: Fujitsu Limited, Kawasaki (JP)

(72) Inventor: Shinichiro Shirota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 135 days.

(21) Appl. No.: 18/314,848

(22) Filed: May 10, 2023

(65) Prior Publication Data

US 2024/0072778 A1 Feb. 29, 2024

(30) Foreign Application Priority Data

Aug. 29, 2022 (JP) ................................ 2022-136172

(51) Int. Cl.
 *H03K 5/00* (2006.01)
 *H03L 7/08* (2006.01)
 *H03K 5/13* (2014.01)

(52) U.S. Cl.
 CPC ....... *H03K 5/00006* (2013.01); *H03L 7/0807* (2013.01); *H03K 5/13* (2013.01)

(58) Field of Classification Search
 CPC .... H03K 5/13; H03K 5/00006; H03L 7/0807; G06F 1/08
 See application file for complete search history.

(56) References Cited

U.S. PATENT DOCUMENTS

| | | | |
|---|---|---|---|
| 9,628,089 B1* | 4/2017 | Jain | H03K 5/135 |
| 10,348,281 B1* | 7/2019 | Oliver | G06F 1/305 |
| 2009/0147610 A1 | 6/2009 | Shikata | |
| 2013/0318364 A1* | 11/2013 | Berry, Jr. | G06F 11/3062 713/300 |
| 2016/0072491 A1* | 3/2016 | Bowman | H03K 5/134 327/276 |

FOREIGN PATENT DOCUMENTS

| | | |
|---|---|---|
| JP | 2000-077999 A | 3/2000 |
| JP | 2008-311767 A | 12/2008 |

* cited by examiner

*Primary Examiner* — Tuan T Lam
(74) *Attorney, Agent, or Firm* — Fujitsu Intellectual Property Center

(57) ABSTRACT

An adjusting circuit includes: a detection circuit outputting a detection signal indicative of whether a noise occurs in electric power inputted into an integrated circuit operating in synchronization with a clock signal; and a controlling circuit outputting to the integrated circuit a first clock signal having a first frequency, or a second clock signal having a second frequency lower than the first frequency when the detection signal indicates the noise occurs. The detection circuit includes a first circuit outputting a first delayed clock signal obtained by delaying the first clock signal according to an operation voltage of the integrated circuit, a second circuit outputting a second delayed clock signal obtained by delaying the first clock signal according to a threshold voltage lower than the operation voltage, and an output circuit outputting the detection signal based on a result of comparing phases of the first and second delayed clock signals.

8 Claims, 9 Drawing Sheets

FIG.7

Example of setting information stored in setting holding unit

63a

| Noise detection voltage | Normal CLK | REF_DLCODE | CMP_DLCODE |
|---|---|---|---|
| V_noise1 | F1 | x1 | y1 |
| V_noise2 | F2 | x2 | y2 |
| ⋮ | ⋮ | ⋮ | ⋮ |

CLOCK FREQUENCY ADJUSTING CIRCUIT AND METHOD FOR ADJUSTING CLOCK FREQUENCY

CROSS-REFERENCE TO RELATED APPLICATION

This application is based upon and claims the benefit of priority of the prior Japanese Patent application No. 2022-136172, filed on Aug. 29, 2022, the entire contents of which are incorporated herein by reference.

FIELD

The embodiment discussed herein is related to a clock frequency adjusting circuit and a method for adjusting a clock frequency.

BACKGROUND

In recent years, electric current consumed by an internal circuit in an integrated circuit (IC), such as a Large-Scale Integration (LSI), has been increasing. When a rise in the electric current consumption causes an increase in the electric current change upon a calculation load fluctuation, a large power supply noise may occur in a power supply voltage to be supplied to the internal circuit. The occurrence of a power supply noise causes a drop in the power supply voltage and a clock frequency, and consequently increases a delay time of the internal circuit.

In designing an LSI, a margin may be provided to a timing of an operation in an internal circuit so as to absorb such increased delay time. Since a larger margin is provided as a larger power source noise is assumed, the presence of the margin hinders designing for enhancing a frequency of the LSI and lowering consumed electric power.

In order to eliminate or reduce the margin in designing, a system has been known in which a clock selection circuit lowers, when a noise detection circuit detects occurrence of a power supply noise, a clock frequency of an internal circuit of an LSI.

In this system, the noise detection circuit uses a noise detection voltage higher than the operation limit voltage of the internal circuit. The noise detection circuit monitors the power supply voltage, and detects occurrence of a power supply noise when the power supply voltage drops below the noise detection voltage. The operation limit voltage is the limit voltage at which the internal circuit can operate at a normal frequency (without lowering the frequency). Further, in the system, the clock selection circuit changes the clock frequency of the internal circuit by selecting one of multiple clock frequencies different from one another according to a state of detection by the noise detection circuit and providing the selected clock frequency to the internal circuit.

For example, related arts are disclosed in Japanese Laid-open patent Publication No. 2008-311767 and Japanese Laid-open patent Publication No. 2000-077999.

SUMMARY

According to an aspect of the embodiments, a clock frequency adjusting circuit includes: a detection circuit that outputs a detection signal indicative of whether or not a noise occurs in electric power inputted into an integrated circuit operating in synchronization with a clock signal; and a clock frequency controlling circuit that outputs a first clock signal having a first clock frequency to the integrated circuit, and outputs, when the detection signal inputted from the detection circuit indicates occurrence of the noise, a second clock signal having a second clock frequency lower than the first clock frequency to the integrated circuit in place of the first clock signal. The detection circuit includes a first delay circuit that outputs a first delayed clock signal obtained by delaying the first clock signal according to an operation voltage of the integrated circuit, a second delay circuit that outputs a second delayed clock signal obtained by delaying the first clock signal according to a threshold voltage lower than the operation voltage, and a detection signal output circuit that outputs the detection signal based on a result of comparing a phase of the first delayed clock signal and a phase of the second delayed clock signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a diagram illustrating an example of setting information held by a setting holding unit;

DESCRIPTION OF EMBODIMENT(S)

Figure 1:
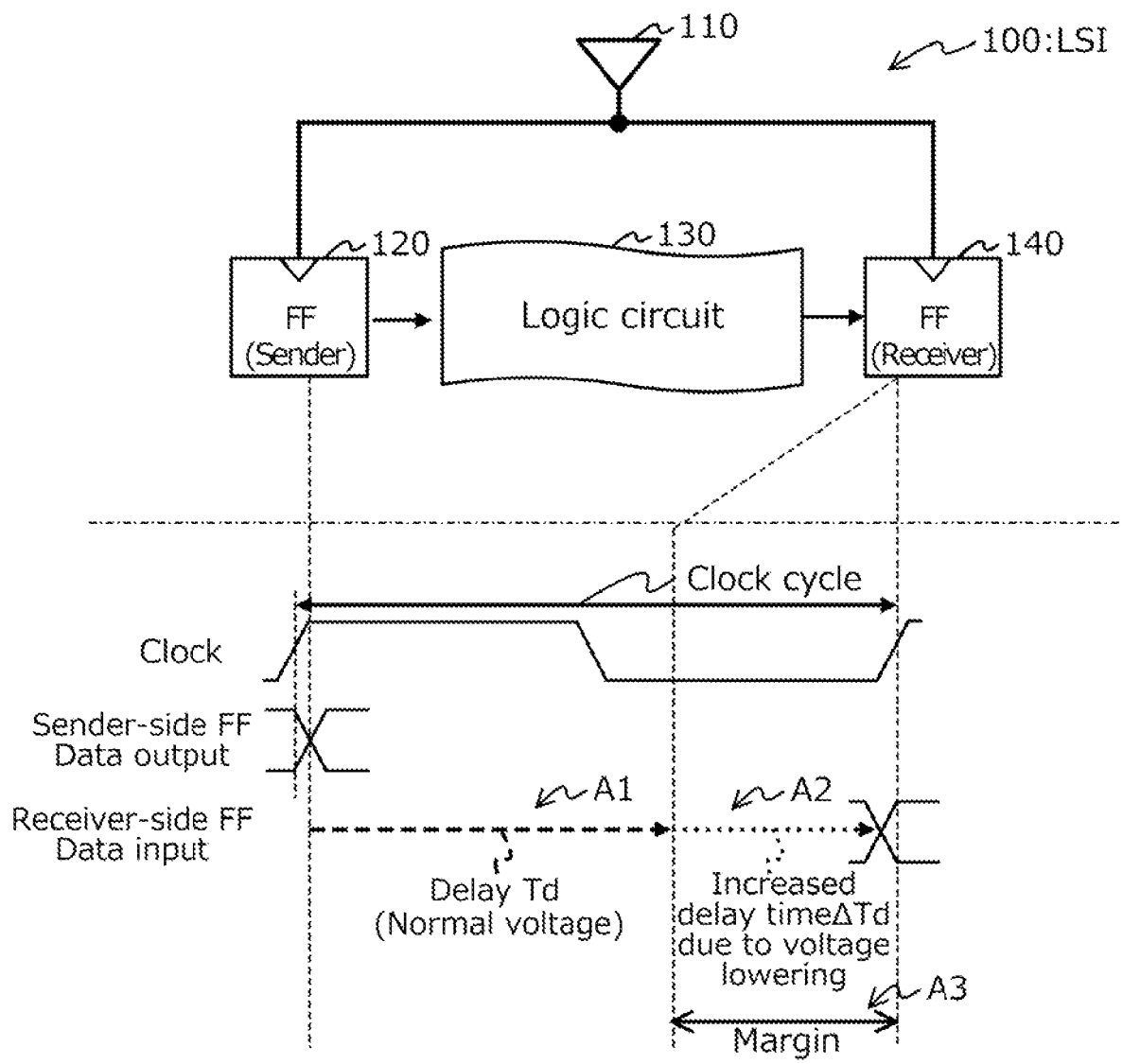
FIG. 1 is a diagram for explaining a delay time in an LSI according to a comparative example.

In the system described above, a delay time is generated from the time when the noise detection circuit detects occurrence of a power supply noise to the time when the clock selection circuit lowers the clock frequency.

Since the power supply voltage continues to drop during the delay time, the noise detection voltage is set to a voltage having an ample margin for the operation limit voltage. However, since a larger margin makes the noise detection voltage closer to the power supply voltage at a normal state, occurrence of a power source noise is detected by only a small drop in the voltage from the power supply voltage at the normal state. This may deteriorate the performance of the LSI.

Alternatively, it is conceivable to set the operating voltage during the normal state to be sufficiently higher than the noise detection voltage, to thereby prevent a detection of power supply noises due to small voltage drops from the operating voltage during the normal state. However, this scheme increases the power consumed by the LSI.

Hereinafter, an embodiment of the present disclosure will now be described with reference to the drawings. However, the embodiments described below are merely illustrative and there is no intention to exclude the application of various modifications and techniques that are not explicitly described in the embodiment. For example, the present embodiment can be variously modified and implemented without departing from the scope thereof. In the drawings used in the following description, the same reference numerals denote the same or similar parts unless otherwise specified.

(A) Comparative Example

FIG. 1 is a diagram for explaining a delay time in an LSI 100 according to a comparative example. FIG. 1 illustrates an example in which data is transferred from a data output (sender) side FF (Flip Flop) 120 to a data input (receiver) side FF 140 through a logic circuit 130 by a clock signal provided by a CLK (Clock) driver 110 in an LSI 100.

As illustrated in FIG. 1, when the power supply voltage (hereinafter, sometimes referred to as an "LSI voltage") supplied to the LSI 100 is a normal voltage, the time for transferring data from the FF 120 to the FF 140 is a delay Td indicated by a dashed line (see the reference sign A1). The normal voltage is a voltage in a normal state exemplified by a state in which no power supply noise is occurring or a state in which a power supply noise is below a given level.

On the other hand, when the power supply voltage supplied to the LSI 100 lowers, the time for transferring data becomes the total time (Td+ΔTd) of the delay Td and an increased delay time ΔTd (refer to the reference sign A2) indicated by the dashed line. The delay time ΔTd increases more as the power supply noise increases. For the above, in designing an LSI, a margin (refer to the reference sign A3) is ensured corresponding to the magnitude of a power supply noise that may occur in the LSI 100. The presence of this margin hinders design for improving the frequency of an LSI and reducing consumed electric power.

Figure 2:
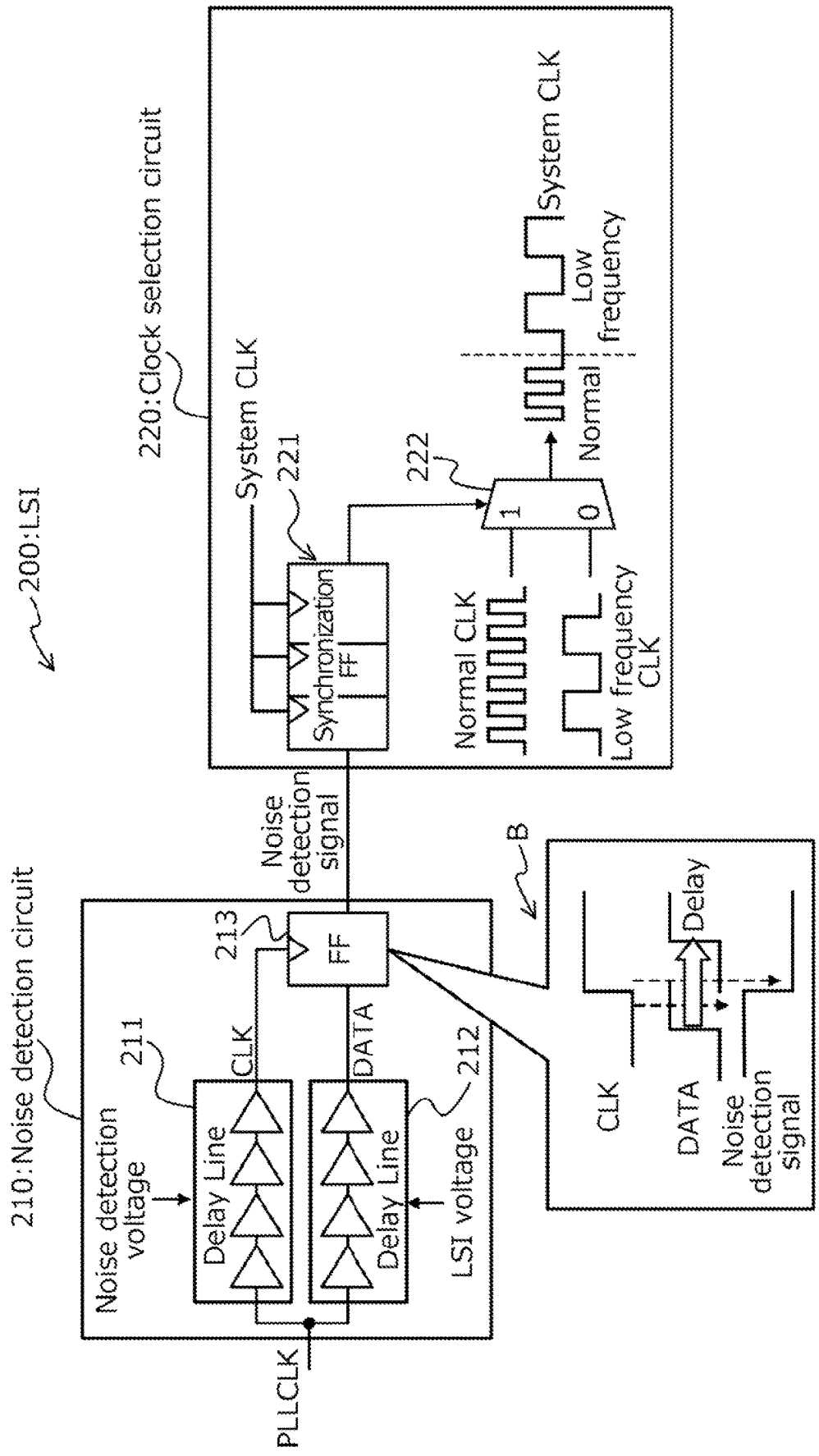
FIG. 2 is a block diagram illustrating an example of a configuration of an LSI of the comparative example.

FIG. 2 is a block diagram illustrating an example of a configuration of an LSI 200 of the comparative example. As illustrated in FIG. 2, the LSI 200 includes a noise detection circuit 210 that detects occurrence of a power supply noise, and a clock selection circuit 220 that lowers a clock frequency of the internal circuit in response to detection of occurrence of the power supply noise by the noise detection circuit 210. This configuration can avoid a timing error, and can eliminate or reduce a margin in designing of the LSI 200.

The noise detection circuit 210 includes a DL (Delay Line) 211 to which a predetermined noise detection voltage is applied as an operation voltage, a DL 212 to which an LSI voltage is applied as an operation voltage, and an FF 213. The same clock (PLLCLK: Phase Locked Loop Clock) is inputted into the DLs 211 and 212.

The DLs 211 and 212 delay an inputted clock in accordance with the level of respective applied operation voltages, and output the delayed clocks. The DL 211 outputs a clock CLK obtained by delaying the PLLCLK in accordance with the noise detection voltage, and the DL 212 outputs a clock DATA obtained by delaying the PLLCLK in accordance with the LSI voltage.

As indicated by the reference sign B, the FF 213 outputs a noise detection signal corresponding to a result of comparing a timing of the clock DATA with a timing of the clock CLK to the clock selection circuit 220.

For example, the FF 213 outputs "1" when a rising timing of the clock DATA is earlier in time than a rising timing of the clock CLK, that is, when a delay of the clock DATA is smaller than that of the clock CLK.

Or, the FF 213 outputs "0" when the rising timing of the clock DATA is later in time than the rising timing of the clock CLK, that is, when a delay of the clock DATA is larger than that of the clock CLK.

Delays of the clocks outputted from the DLs 211 and 212 become smaller, for example, as the operation voltage is higher.

For example, when the LSI voltage is higher than the noise detection voltage, the delay of the clock DATA becomes smaller than that of the clock CLK, so that the output of the FF 213 is "1" (which means that no noise is detected).

On the other hand, when the LSI voltage is lower than the noise detection voltage, the delay of the clock DATA is larger than that of the clock CLK, so that the output of the FF 213 is "0" (which means that a noise is detected).

The clock selection circuit 220 includes a synchronization FF 221 and a selection circuit 222.

The synchronization FF 221 synchronizes the noise detection signal inputted from the noise detection circuit 210 with a system CLK used in the internal circuit of the LSI 200 and outputs the synchronized signal.

In response to an outputted signal (selection signal) inputted from the synchronization FF 221, the selection circuit 222 selects either one of a normal CLK and a low frequency CLK lower than the normal CLK, and outputs the selected clock as the system CLK.

For example, the selection circuit 222 selects the normal CLK when the selection signal is "1" (which means that no noise is detected), or selects the low frequency CLK when the selection signal is "0" (which means that a noise is detected).

Figure 3:
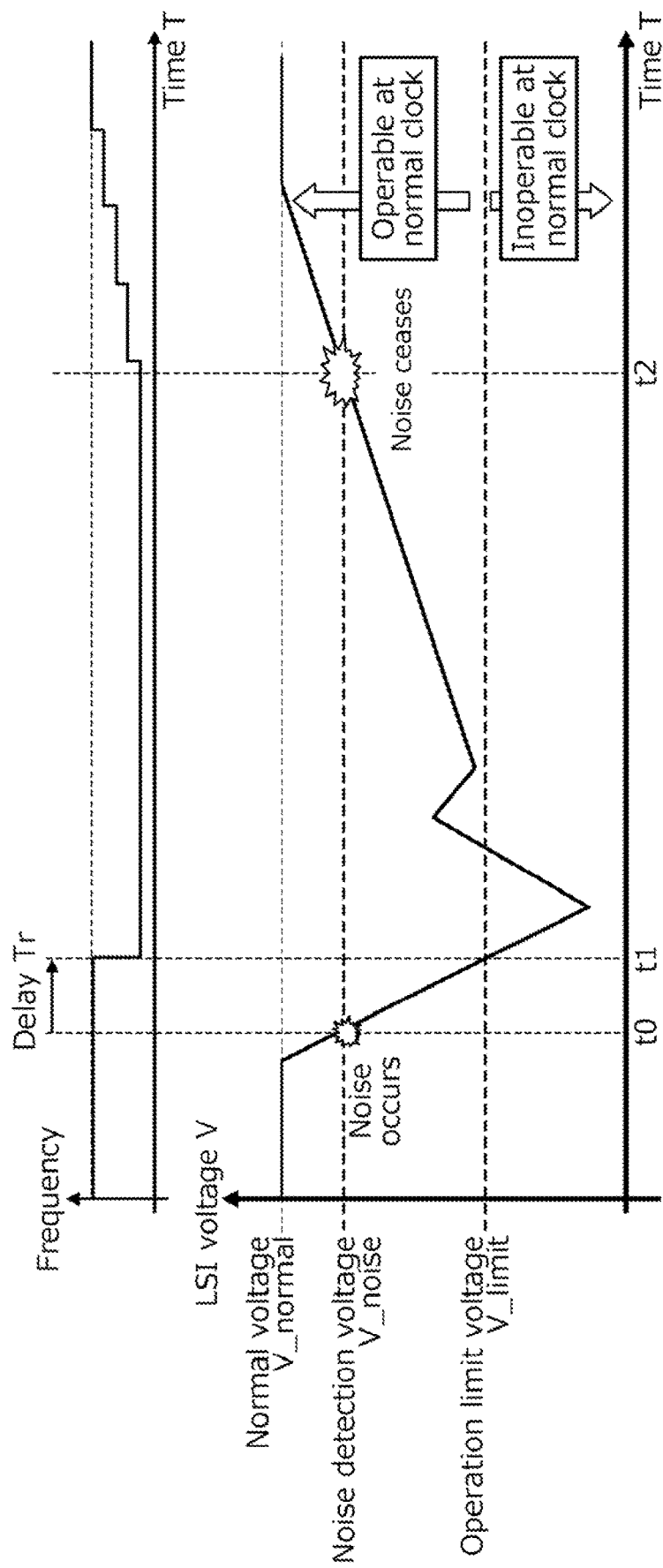
FIG. 3 is a diagram for explaining a frequency adjusting process on the LSI of FIG. 2.

FIG. 3 is a diagram for explaining a frequency adjusting process on the LSI 200 of FIG. 2. For example, as illustrated in FIG. 3, when the LSI voltage V drops from a normal voltage V_normal to a noise detection voltage V_noise at the timing t0, the noise detection circuit 210 outputs "0" as the noise detection signal (i.e., detects occurrence of a power supply noise).

At the timing t1, the clock selection circuit 220 selects and outputs a low frequency CLK in response to the selecting signal "0" (i.e., lowers the frequency of the system CLK).

At the timing t2, when the power supply noise ceases, the LSI voltage V exceeds the noise detection voltage V_noise, and the noise detection circuit 210 outputs "1" as the noise detection signal. In response to the selection signal "1", the clock selection circuit 220 selects and outputs the normal CLK (i.e., sets the frequency of the system CLK back to the normal CLK).

As described above, the LSI 200 can lower the frequency of the system CLK at a timing at which the LSI voltage falls below the noise detection voltage V_noise and thereby can avoid occurrence of a timing error caused by the lowering of the LSI voltage V.

However, as illustrated in FIG. 3, in the LSI 200, there is a delay Tr (t1−t0) between the detection of occurrence of a power source noise by the noise detection circuit 210 and lowering of the frequency of the system CLK by the clock selection circuit 220.

The factors for the delay Tr include, for example, a delay of the noise detection circuit 210, a synchronization delay to synchronize a noise detection signal to a clock of the clock selection circuit 220, a delay of the clock selection circuit 220, and a clock distribution delay. For example, a synchronization delay lasts for about two to three clock cycles, and accounts for a significant percentage of the delay Tr.

As illustrated in FIG. 3, since the LSI voltage V continues to drop during the delay Tr, the noise detection voltage V_noise is set to have a margin for an operation limit voltage V_limit, which is the (lower) limit voltage at which the internal circuit of the LSI 200 can operate.

However, if the noise detection voltage V_noise is increased, even a small noise with which the LSI is still capable of operating without reducing the frequency may cause detection as a voltage drop. In this case, the frequency of the system CLK drops, resulting in reduction in the performance of the LSI 200.

As a solution to avoiding this inconvenience, the normal voltage V_normal is set to be high to ensure a margin between the normal voltage V_normal and a noise detection voltage V_noise, but this increases the consumed electric power of the LSI 200.

Considering the above, in one embodiment, a method of shortening a delay time from detection of occurrence of a power supply noise to lowering of the clock frequency in an integrated circuit is described. By shortening the delay time, a margin for a noise detection voltage with respect to the operation limit voltage of an integrated circuit can be reduced as compared with the LSIs 100 and 200 illustrated in FIGS. 1 to 3, so that the integrated circuit can operate with a low voltage or at a high velocity.

(B) Example of Configuration of One Embodiment

Figure 4:
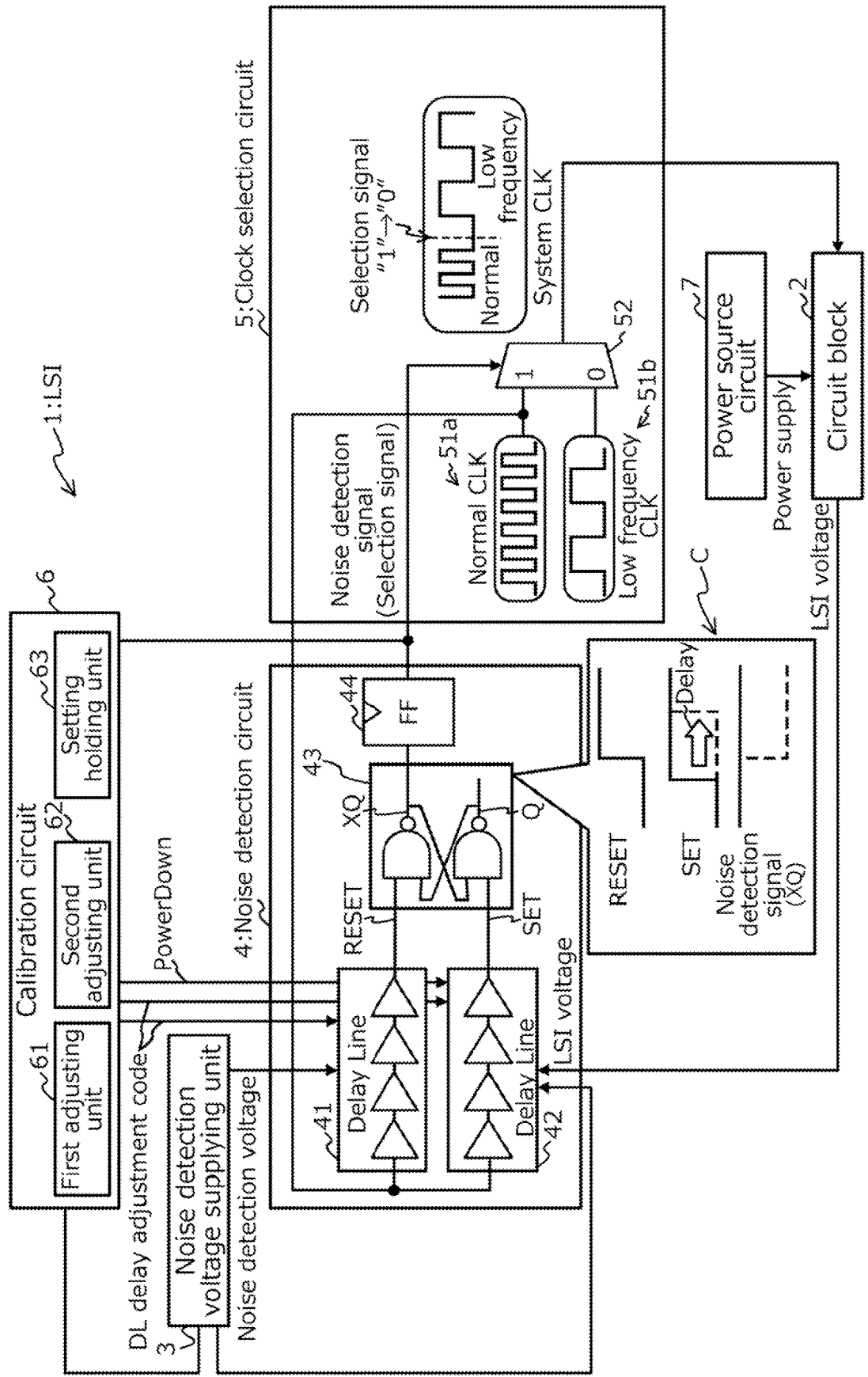
FIG. 4 is a block diagram illustrating an example of a configuration of an LSI according to one embodiment.

FIG. 4 is a block diagram illustrating an example of a configuration of an LSI 1 according to one embodiment.

The LSI 1 is an integrated circuit that operates based on a clock signal (system CLK). The LSI 1 is an example of a system that detects a noise in a supplied power supply voltage and lowers a frequency of a supplied clock signal (system CLK) to avoid occurrence of a timing error. A non-limited example of the LSI 1 includes a processor such as a CPU (Central Processing Unit).

As illustrated in FIG. 4, the LSI 1 may illustratively include a circuit block 2, a noise detection voltage supplying unit 3, a noise detection circuit 4, a clock selection circuit 5, and a calibration circuit 6. The circuit block 2 may be supplied with electric power from a power supply circuit 7. The noise detection voltage supplying unit 3, the noise detection circuit 4, the clock selection circuit 5, and the calibration circuit 6 collectively serve as an example of a clock frequency adjusting circuit.

The circuit block 2 is an internal circuit of the LSI 1 and is an example of an integrated circuit that operates in synchronization with a clock signal. For example, the circuit block 2 operates using the electric power supplied from the power supply circuit 7 outside the LSI 1 and a system CLK supplied from the clock selection circuit 5.

The circuit block 2 may include multiple circuit regions that use respective different LSI voltages. An LSI voltage may be a power supply voltage used in a circuit region of the circuit block 2, and may be a power supply voltage supplied from the power supply circuit 7, for example.

If the circuit block 2 includes multiple circuit regions, the LSI 1 may be provided with the noise detection circuit 4 and the clock selection circuit 5 for each circuit region, in other words, for each combination of a noise detection voltage and a system CLK according to an LSI voltage. In this case, the LSI 1 may control the clock frequency of a system CLK to be supplied to each individual circuit region in accordance with a result of detecting occurrence of a noise based on the LSI voltage of the circuit region.

The power supply circuit 7 supplies electric power from a non-illustrated power supply source to the circuit block 2. For example, the power supply circuit 7 may provide the LSI voltage to the circuit block 2.

If the circuit block 2 includes multiple circuit regions, the power supply circuit 7 may supply each circuit region with the LSI voltage to be used by the circuit region. Alternatively, multiple power supply circuits 7 that supply respective different LSI voltages may be provided. The power supply circuit(s) 7 may be included in the LSI 1.

The circuit block 2 or the power supply circuit 7 (circuit block 2 in the example of FIG. 4) may provide the noise detection circuit 4 with the LSI voltage.

The noise detection voltage supplying unit 3 supplies the noise detection voltage to the DL 41 of the noise detection circuit 4. For example, the noise detection voltage supplying unit 3 may output a noise detection voltage based on electric power (voltage) supplied from the power supply 7, another power supplying source, or the calibration circuit 6.

In addition, the noise detection voltage supplying unit 3 may output a noise detection voltage to the DL 42 of the noise detection circuit 4 in response to an instruction from the calibration circuit 6 in a calibration process to be described below.

Further, when the LSI 1 adopts Dynamic Voltage and Frequency Scaling (DVFS), the noise detection voltage changes with the LSI voltage. For the above, the noise detection voltage supplying unit 3 may be capable of outputting multiple noise detection voltages in cooperation with calibration circuit 6 to be described below.

The noise detection circuit 4 is an example of a detection signal indicative of whether or not a noise occurs in electric power to be inputted into the circuit block 2. For example, the noise detection circuit 4 performs a noise occurrence detecting process (delay measuring process) that detects occurrence of a power source noise on the basis of the LSI voltage and the noise detection voltage.

The clock selection circuit 5 is an example of a clock frequency controlling circuit that outputs a normal CLK to the circuit block 2, and outputs, when a detection signal input from the noise detection circuit 4 indicates occurrence of a noise, a low frequency CLK to the circuit block 2 in place of the normal CLK. For example, the clock selection circuit 5 lowers the clock frequency of the system CLK to be supplied to the circuit block 2 in response to detection of occurrence of a power supply noise by the noise detection circuit 4.

The following description focuses on the noise detection circuit 4 and the clock selection circuit 5 provided in association with a certain circuit region in the circuit block 2 (i.e., a combination between the noise detection voltage and the system CLK according to the LSI voltage). For example, the following description assumes that the noise detection circuit 4 and the clock selection circuit 5 control a clock frequency of the system CLK to be supplied to a certain circuit region on the basis of an LSI voltage to be supplied to the certain region.

The noise detection circuit 4 illustratively includes the DLs 41 and 42, a Set Reset (SR) circuit 43, and an FF 44.

The DLs 41 and 42 each delay an inputted clock in accordance with the magnitude of the applied operation voltage (driving voltage), and output the delayed clock to the SR circuit 43. The same clock is inputted to the DLs 41 and 42. In the noise detection circuit 4 of the one embodiment, the normal CLK outputted from a clock generating source 51*a* is inputted to both the DLs 41 and 42. The normal CLK is an example of a first clock signal having a first clock frequency, and is a clock signal supplied to the circuit block 2 as the system CLK under a state where occurrence of a power supply noise is not detected.

For example, the DL 41 is applied with a noise detection voltage, as an operation voltage, from the noise detection voltage supplying unit 3, and outputs a clock RESET obtained by delaying the normal CLK according to the noise detection voltage. The DL 41 is an example of a second delay circuit that outputs a second delayed clock signal obtained by delaying the normal CLK according to the noise detection voltage. The noise detection voltage is an example of a threshold voltage lower than the operation voltage, and the clock RESET is an example of a second delayed clock signal.

Furthermore, for example, the DL 42 is applied with the LSI voltage, as an operation voltage, from the circuit block 2 (or the power supply circuit 7), and outputs a clock SET obtained by delaying the normal CLK according to the LSI voltage. The DL 42 is an example of a first delay circuit that outputs a first delayed clock signal obtained by delaying the normal CLK according to the LSI voltage. The LSI voltage is an example of the operation voltage of the circuit block 2, and the clock SET is an example of the first delayed clock signal.

The SR circuit 43 is a circuit that compares the output phases (timings) of clock signals output from the DLs 41 and 42 and that outputs a result of the comparing. In other words, the SR circuit 43 is an example of a comparison circuit that outputs the result of comparing based on whether or not a rising timing of the clock SET is earlier than a rising timing of the clock RESET. For example, the SR circuit 43 may output XQ as the result of the comparing among two outputs Q and XQ.

For example, as indicated by the reference sign C, the result XQ of the comparing from the SR circuit 43 is "1" when the rising timing of the clock SET from the DL 42 is earlier in time than the rising timing of the clock RESET from the DL 41.

On the other hand, the result XQ of the comparing from the SR circuit 43 is "0" when the rising timing of the clock SET from the DL 42 is later in time (i.e., delayed) than the rising timing of the clock RESET from the DL 41.

The example of FIG. 4 assumes that the SR circuit 43 is a circuit using a NAND gate, but is not limited this. The SR circuit 43 may be replaced with any circuit capable of obtaining an output similar to that in the example of FIG. 4 in response to an input similar to that in the example of FIG. 4.

The FF 44 is an example of an output circuit that outputs the result of comparing at a timing synchronized with the normal CLK. For example, as illustrated by the reference sign C, the FF 44 outputs a noise detection signal according to the result XQ of the comparing from the SR circuit 43 to the clock selection circuit 5.

Delays of clock signals outputted from the DLs 41 and 42 decrease, for example, as the operation voltage is higher.

For example, when the LSI voltage is higher than the noise detection voltage, the delay of the clock SET becomes smaller than that of the clock RESET, so that the output of the FF 44 is "1" (which means that no noise is detected).

On the other hand, when the LSI voltage is lower than the noise detection voltage, the delay of the clock SET is larger than that of the clock RESET, so that the output of the FF 44 is "0" (which means that a noise is detected).

As described above, the SR circuit 43 and the FF 44 collectively serve as one example of a detection signal output circuit that outputs a detection signal based on a result of comparing a phase of the clock SET and a phase of the clock RESET.

The clock selection circuit 5 may include, for example, clock generating sources 51*a* and a 51*b*, and a selection circuit 52.

The clock generating sources 51*a* and 51*b* may each be a circuit that outputs a clock signal having a predetermined clock frequency, and may be exemplified by an oscillation circuit using a crystal resonator or the like. The clock generating sources 51*a* and 51*b* may be an oscillation circuit that outputs clocks signal having multiple different clock frequencies, or may be separated oscillation circuits.

The clock generating source 51*a* outputs a normal CLK. The clock generating source 51*b* outputs a low frequency CLK having a lower frequency than that of the normal CLK. The low frequency CLK is an example of a second clock signal having a second clock frequency lower than the first clock frequency.

The selection circuit 52 selects one of the normal CLK and the low frequency CLK as a system CLK in response to the noise detection signal inputted from the noise detection circuit 4, and outputs the selected system CLK to the circuit block 2. The selection circuit 52 is exemplified by circuitry of a selector or a multiplexer.

As one example, the selection circuit 52 selects the normal CLK when the noise detection signal (selection signal) is "1" (which means that no noise is detected), and selects the low frequency CLK when the noise detection signal is "0" (which means that a noise is detected).

As described above, the LSI 1 can synchronize the noise detection circuit 4 with the clock selection circuit 5 by operating the noise detection circuit 4 with the normal CLK before lowering the clock frequency.

This configuration allows the LSI 1 of the one embodiment to omit the synchronization FF 221 of clock selection circuit 220 illustrated in FIG. 2. In other words, this can reduce (shorten) the synchronization delay of the noise detection signal, which accounts for a large percentage of the delay time Tr (see FIG. 3) from detection of a noise to lowering of the clock frequency.

For example, the synchronization delay is about two to three clock cycles. On the other hand, in the LSI 1 of the one embodiment, the clock selection circuit 5 can output the low frequency CLK after one clock cycle of the normal CLK since the detection of occurrence of the noise.

In addition, since the delay time Tr can be shortened by reducing the synchronization delay, the margin of the noise detection voltage V_noise for the operation limit voltage V_limit can be set to be smaller than that of the LSI 200 described with reference to FIGS. 2 and 3. This can suppress detection of occurrence of a power supply noises due to a small voltage drop from the power supply voltage at the normal state, so that degradation of processing performance of the LSI 1 due to frequent frequency lowering can be suppressed.

In addition, an eliminated requirement for an ample margin set for the noise detection voltage means that setting the operation voltage at the normal state to a voltage sufficiently higher than the noise detection voltage is not required any longer. Consequently, an increase in the consumed electric power of the LSI 1 can be suppressed.

The calibration circuit 6 is an example of an adjustment circuit that adjusts respective amounts of delays in the DL 41 and the DL 42 such that the delays by which the normal CLK is delayed in the DLs 41 and 42 according to the noise detection voltage comes to be within the clock cycle of the clock frequency of the normal CLK.

For example, the calibration circuit 6 executes a calibration process (initial adjustment sequence) for synchronizing the noise detection circuit 4 with the clock selection circuit 5. For example, the calibration circuit 6 may execute the calibration process at a timing prior to starting the operation when, for example, the LSI 1 is started.

As illustrated in FIG. 4, the calibration circuit 6 may include a first adjusting unit 61, a second adjusting unit 62, and a setting holding unit 63.

No design-restriction on a passage delay applied to a PLLCLK to be inputted is set for the DLs 211 and 212 of the LSI 200 illustrated in FIG. 2. Therefore, for example, in order to obtain a large conversion gain from a voltage change to a delay change, the large amounts of delays according to a voltage change of the applied voltage may be set for the DLs 211 and 212.

In contrast to the above, the LSI 1 according to the one embodiment has a configuration in which the noise detection circuit 4 is synchronized with the clock selection circuit 5. In order to ensure this synchronization configuration, the first adjusting unit 61 executes a first adjusting sequence in the calibration process. The first adjusting sequence is calibration for the DL 41, and is a process to make a delay time from the input of the normal CLK into the DLs 41 and 42 to the input of data (XQ) into the FF 44 within one clock cycle.

Figure 5:
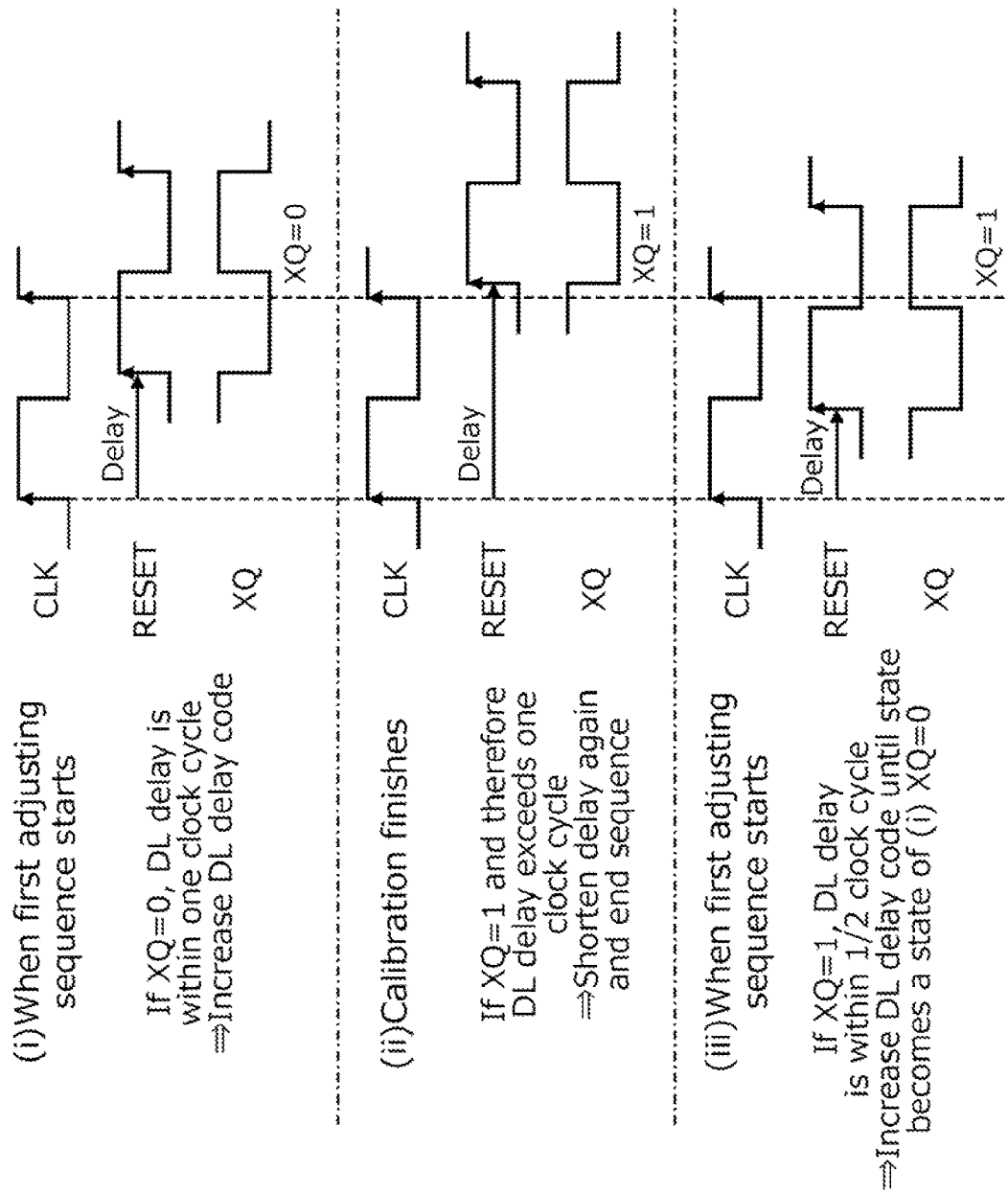
FIG. 5 is a diagram for explaining an example of a first adjusting sequence performed by a calibration circuit (first adjusting unit)

FIG. 5 is a diagram for explaining an example of a first adjusting sequence performed by the calibration circuit 6 (first adjusting unit 61).

In the first adjusting sequence, the first adjusting unit 61 sets the DL 42 supplied with the LSI voltage so that the DL 42 fixedly outputs the HIGH (e.g., "1"). As one example, the first adjusting unit 61 causes the DL 42 to fixedly output the HIGH by sending a PowerDown signal to turn off the DL 42 to the DL 42.

This makes the input (XQ) into the FF 44 match the inversion of the clock signal RESET obtained by applying a delay according to the noise detection signal to the normal CLK to be inputted into the DL 41. Accordingly, the first adjusting unit 61 can determine whether or not the delay of the DL 41 is within one clock cycle by referring to the value "0" or "1" of the noise detection signal outputted from the FF 44.

The first adjusting unit 61 increases the amount of delay of the DL 41 by sending the DL 41 a DL delay adjustment code for adjusting an amount of delay of the DL 41 on the basis of the output (noise detection signal) from the FF 44. A DL delay adjustment code is, for example, a code (DLCODE) to increase an amount of delay of the DL 41. As an example, DLCODE may be set to an integer equal to or greater than "0". For example, as DLCODE increases (in increments of one "1"), the amount of delay of the DL 41 may be made to increase stepwise.

As illustrated in (i) of FIG. 5, if XQ (noise detection voltage)=0 when the first adjusting sequence starts, the delay in the DL 41 is determined to be within a one clock cycle. In this case, the first adjusting unit 61 increases the value of DLCODE stepwise (i.e., in increments of one "1") from the initial value "0" of DLCODE such that an amount of delay of DL 41 becomes as large as possible.

As illustrated in (ii) of FIG. 5, when XQ is switched to 1 as a result of the increase in the value of DLCODE, the delay of the DL 41 slightly exceeds one clock cycle. In this case, the first adjusting unit 61 reduces the amount (DLCODE) of delay of the DL 41 by a predetermined margin and ends the first adjusting sequence.

Here, the predetermined margin may be, for example, "1" (amount of delay in one step), which is the increment unit of DLCODE, or may be larger than "1", considering the difference between at the time when the first adjusting sequence is executed and at the time when the LSI 1 is operating. An example of the difference is an error such as a thermal difference of the DL 41 (LSI 1) between at the time when the first adjusting sequence is executed and at the time when the LSI 1 is operating.

Through the above, the first adjusting unit 61 specifies DLCODE that is to serve as the amount of delay of the DL 41. When the first adjusting sequence ends, the first adjusting unit 61 stops the transmission of the PowerDown signal to the DL 42.

In this way, the first adjusting unit 61 calibrates the amount of delay of the DL 41 such that the amount of delay of the DL 41 is maximized in one clock cycle. This makes it possible to increase the total amount of change in delay in DL 41 and 42 according to the voltage. Therefore, since the noise detection circuit 4 can detect a switch of the value of XQ which is caused by slight change of a delay (SET) of the DL 42 to be compared with a delay (RESET) of the DL 41, it is possible to improve the precision of the noise detection.

Besides, as illustrated in (iii) of FIG. 5, if XQ=1 when the first adjusting sequence starts, the delay in the DL 41 is determined to be within 1/2 clock cycle. An example of such a case include a cases where the clock frequency of the normal CLK is excessively small in relation to an amount of delay of the DL 41 (which means that the normal CLK is excessively low). As a solution to this case, the first adjusting unit 61 increases DLCODE stepwise (in increments of "1"). When the value of XQ is switched to 0 as a result of an increase in the DLCODE (see (i) of FIG. 5), the first adjusting unit 61 performs the process described with reference to above (i) and (ii).

As illustrated in (iii) of FIG. 5, a case where XQ=1 when the first adjusting sequence starts is assumed to be a case where the delay in the DL 41 exceeds one clock cycle. However, such assumptions may be excluded because the amount of delay is the smallest (DLCODE="0") when the first adjusting sequence starts and the DLs 41 and 42 are designed such that the delay time Tr in the LSI 1 is within one clock cycle.

As described above, the first adjusting sequence by the first adjusting unit 61 can make the delay time from input of the normal CLK into the DLs 41 and 42 to the input of the XQ into the FF 44 within one clock cycle.

The second adjusting unit 62 executes a second adjustment sequence in the calibration process after the first adjustment sequence is completed. The second adjusting sequence is calibration for the DL 42, and is a process for causing the amount of delay of the DL 41 to match the amount of delay of the DL 42 when the noise detection voltage matches the LSI voltage.

For example, the second adjusting unit 62 sets the operation voltage of the DL 42 to the noise detection voltage in the second adjusting sequence. For example, the second adjusting unit 62 may apply the noise detection voltage from the noise detection voltage supplying unit 3 to the DL 42, or may lower the LSI voltage to be applied from the circuit block 2 to the DL 41 to the value of the noise detection voltage.

In addition, the second adjusting unit 62 outputs (sets) DL delay adjustment code specified in the first adjusting sequence to (in) the DL 41, and outputs a DL delay adjustment code for the DL 42 set to the initial value "0" to the DL 42. This results in the rise of the clock SET from the DL 42 having the smallest amount of delay occurring earlier (i.e. with less delay) than the rise of the clock RESET from the DL 41. Accordingly, the output of the FF 44 is XQ (noise detection voltage)=1.

The second adjusting unit 62 increases the DLCODE to be output to the DL 42 stepwise (e.g., in increment of "1") by referring to XQ until XQ=0 is satisfied, i.e., the delay of the DL 41 matches the delay of the DL 42.

Then, the second adjusting unit 62 specifies the DLCODE at the time when XQ=0 as the amount of delay of the DL 42, and ends the second adjusting sequence. At the end of the second adjusting sequence, the second adjusting unit 62 changes the voltage to be applied to the DL 42 from the noise detection voltage to the LSI voltage.

As described above, the second adjusting sequence by the second adjusting unit 62 can make the amount of delay of the DL 42 to match the amount of delay of the DL 41 when the same voltage is applied to the DLs 41 and 42. Consequently, since the difference between the DLs 41 and 42, which is exemplified by a production error between the DLs 41 and 42 or an environmental error such as a temperature difference caused by, for example, arrangement of the DLs 41 and 42 can be canceled out, the precision of the noise detection can be enhanced.

Upon completion of the calibration process, the calibration circuit 6 sets the DLCODE of the DL 41 specified in the first adjustment sequence in the DL 41, and sets the DLCODE of the DL 42 specified in the second adjustment sequence in the DL 42. This optimizes the synchronization configuration between the noise detection circuit 4 and the clock selection circuit 5.

Figure 6:
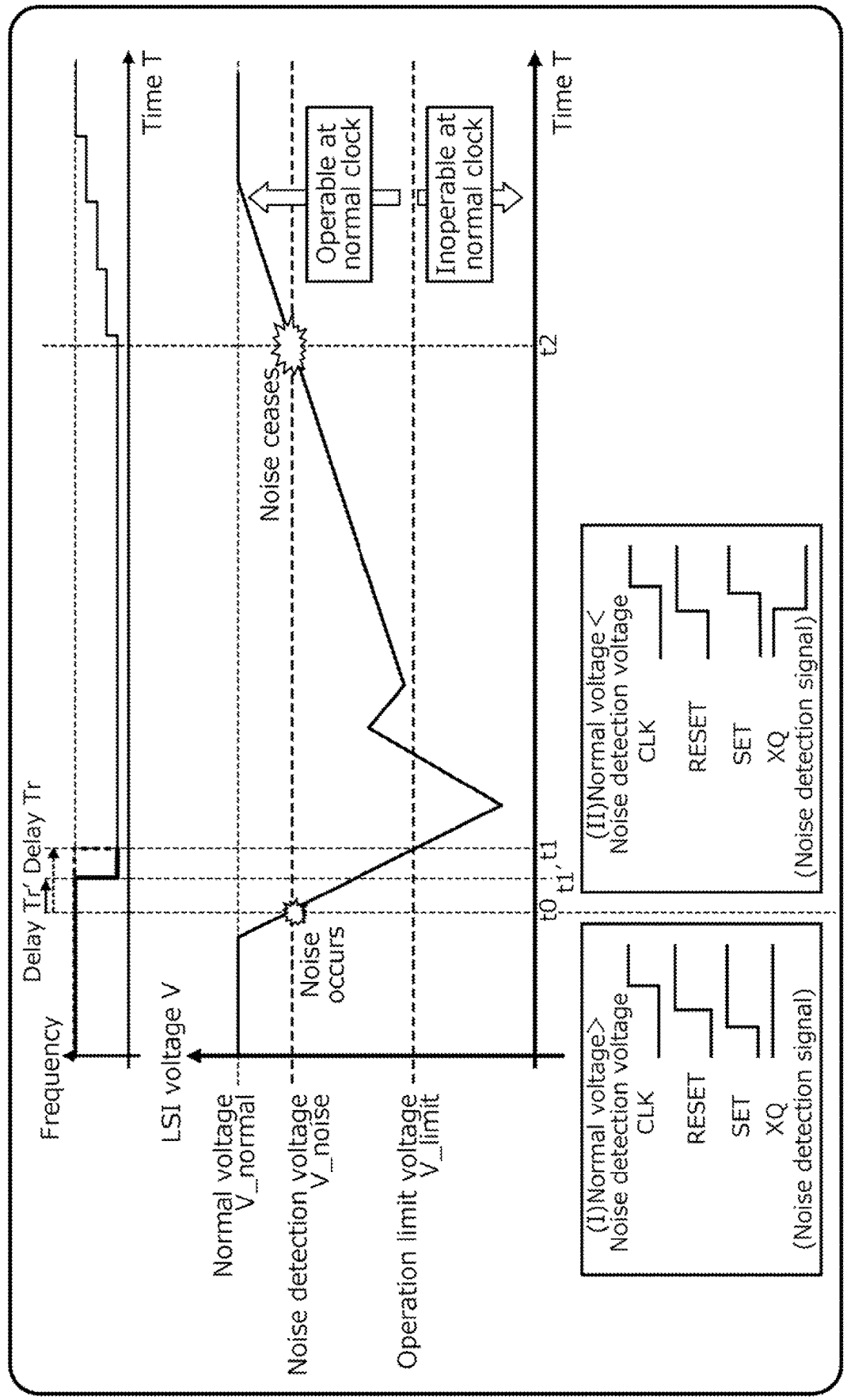
FIG. 6 is a diagram illustrating an example of a phase relationship of a clock signal in a noise detection circuit of the one embodiment.

FIG. 6 is a diagram illustrating an example of a phase relationship of a clock signal in the noise detection circuit 4 of the one embodiment. FIG. 6 illustrates an example of a phase relationship of the CLK, the RESET, the SET, and the XQ before and after occurrence of a power supply noise after the synchronization configuration is optimized. For example, (I) in FIG. 6 illustrates a phase relationship before the occurrence of a power supply noise (before t0), and (II) in FIG. 6 illustrates a phase relationship after the occurrence of the power supply noise (after t0).

As illustrated in FIG. 6, the phase relation of the CLK and the RESET does not change between (I) and (II).

In (I), the timing at which the SET turns HIGH is earlier than the timing at which RESET turns HIGH. In this instance, the XQ stays HIGH ("1"), and the FF 44 is inputted with XQ=1 at the timing when the CLK turns HIGH.

On the other hand, in (II), the timing at which SET turns HIGH is later than the timing at which RESET turns HIGH. In this case, the XQ turns LOW ("0") at the timing at which the RESET turns HIGH, and the FF 44 is input with XQ=0 at the timing at which the CLK turns HIGH.

As described above, the LSI 1 of the one embodiment can advance the timing of lowering the frequency from t1 to t1'. In other words, the LSI 1 can shorten the delay Tr (dashed line) from the occurrence of a noise to the lowering of the frequency (system CLK) to the delay Tr' (solid line). This means that the noise detection voltage V_noise can be set smaller (i.e., a margin for the operation limit voltage V_limit can be smaller).

Setting the noise detection voltage V_noise to be smaller makes it possible to reduce the sensitivity to detect occurrence of a power supply noise and also to reduce the frequency of control to lower the frequency, so that degradation of the processing performance of the LSI 1 can be suppressed. Further, since the difference between the noise detection voltage V_noise and the normal voltage V_normal can be increased, an increase in the consumed electric power of the LSI 1 can be suppressed.

As described above, as compared with the LSI 200 illustrated in FIGS. 2 and 3, it is possible to achieve low voltage or high speed of the LSI 1.

When the calibration process is completed, the calibration circuit 6 may store (hold) the value of the DLCODE of each of the DLs 41 and 42 in the setting holding unit 63.

The setting holding unit 63 is an example of a storing region that the calibration circuit 6 or a circuit external to the calibration circuit 6 includes. For example, the setting holding unit 63 may be a register or a non-volatile memory. Assuming that the setting holding unit 63 is a non-volatile memory, the calibration circuit 6 may set DLCODEs in the DLs 41 and 42 when the LSI 1 is started, using the result of the calibration process performed in the past.

Here, if the LSI 1 performs a DVFS operation, multiple combinations of the LSI voltage and the system CLK to be supplied to the circuit block 2 (a certain circuit region) are present.

For example, the calibration circuit 6 may perform the calibration process on each combination of the LSI voltage and the system CLK to be supplied to the circuit block 2 (circuit region), and store the values of the DLCODEs specified by the calibration process in the setting storing device 63.

In FIG. 7, the setting information is illustrated in a table format, but is not limited to this form. The setting information 63a may be in various formats such as an array.

As illustrated in FIG. 7, the setting information 63a may illustratively include items of the noise detection voltage, the normal CLK, a REF_DLCODE, and a CMP_DLCODE. The noise detection voltage and the normal CLK are a combination of the noise detection voltage and the normal clock corresponding to the LSI voltage to be supplied to the circuit region of the circuit block 2. The REF_DLCODE is a value of the DL adjustment code of the DL 41 specified in the calibration process on each of the combinations of the noise detection voltage and the normal CLK by the first adjusting unit 61. The CMP_DLCODE is a value of the DL adjustment code of the DL 42 specified for each of the combinations of the noise detection voltage and the normal CLK by the second adjusting unit 62.

For example, in response to a change of at least one of the LSI voltage and the normal CLK in the circuit block 2, the calibration circuit 6 may read, through the DVFS operation, an entry associated with a combination of the noise detection voltage and the normal CLK corresponding to the LSI voltage after the change. Then, the calibration circuit 6 may set the REF_DLCODE and the CMP_DLCODE in the read entry (profile) in the DL 41 and the DL 42, respectively.

Accordingly, even when performing a DVFS operation, the LSI 1 can complete the control of lowering the frequency from the detection of the occurrence of a power supply noise within one clock cycle for each combination of the LSI voltage and the normal CLK to be supplied to a certain circuit region.

As described above, the noise detection circuit 4 and the clock selection circuit 5 may be provided for each circuit region. On the other hand, the calibration circuit 6 may be provided for each circuit region, or may be provided for each of two or more combinations of noise detection circuits 4 and clock selection circuits 5. If the calibration circuit 6 is provided for each of two or more combinations of the noise detection circuits 4 and the clock selection circuits 5, an item for specifying the each combination of the noise detection circuits 4 and the clock selection circuits 5 may be added to the setting information 63*a*, for example.

(C) Example of Operation

Figure 8:
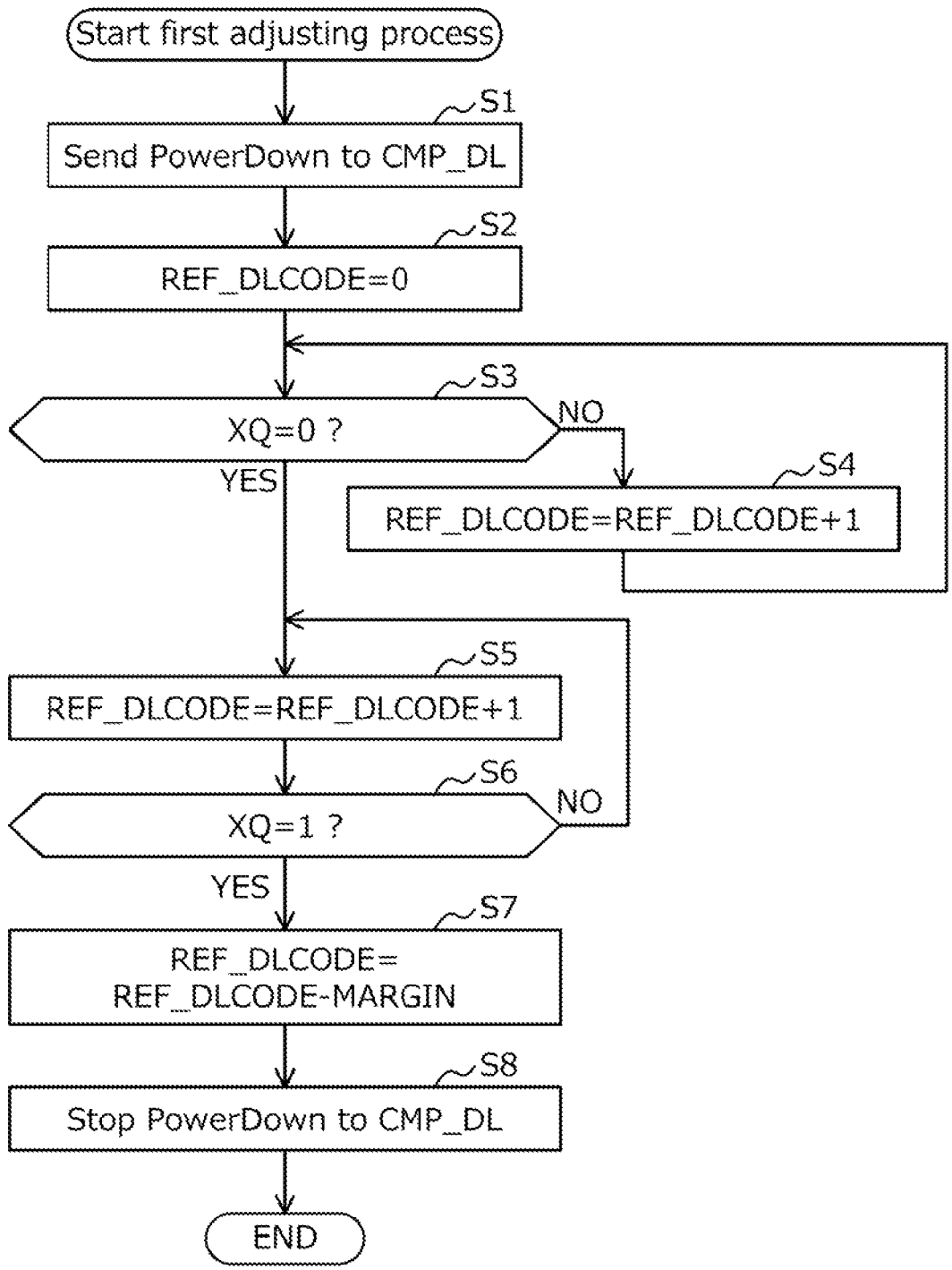
FIG. 8 is a flow diagram for explaining an example of the operation of the first adjusting unit of the one embodiment.
Figure 9:
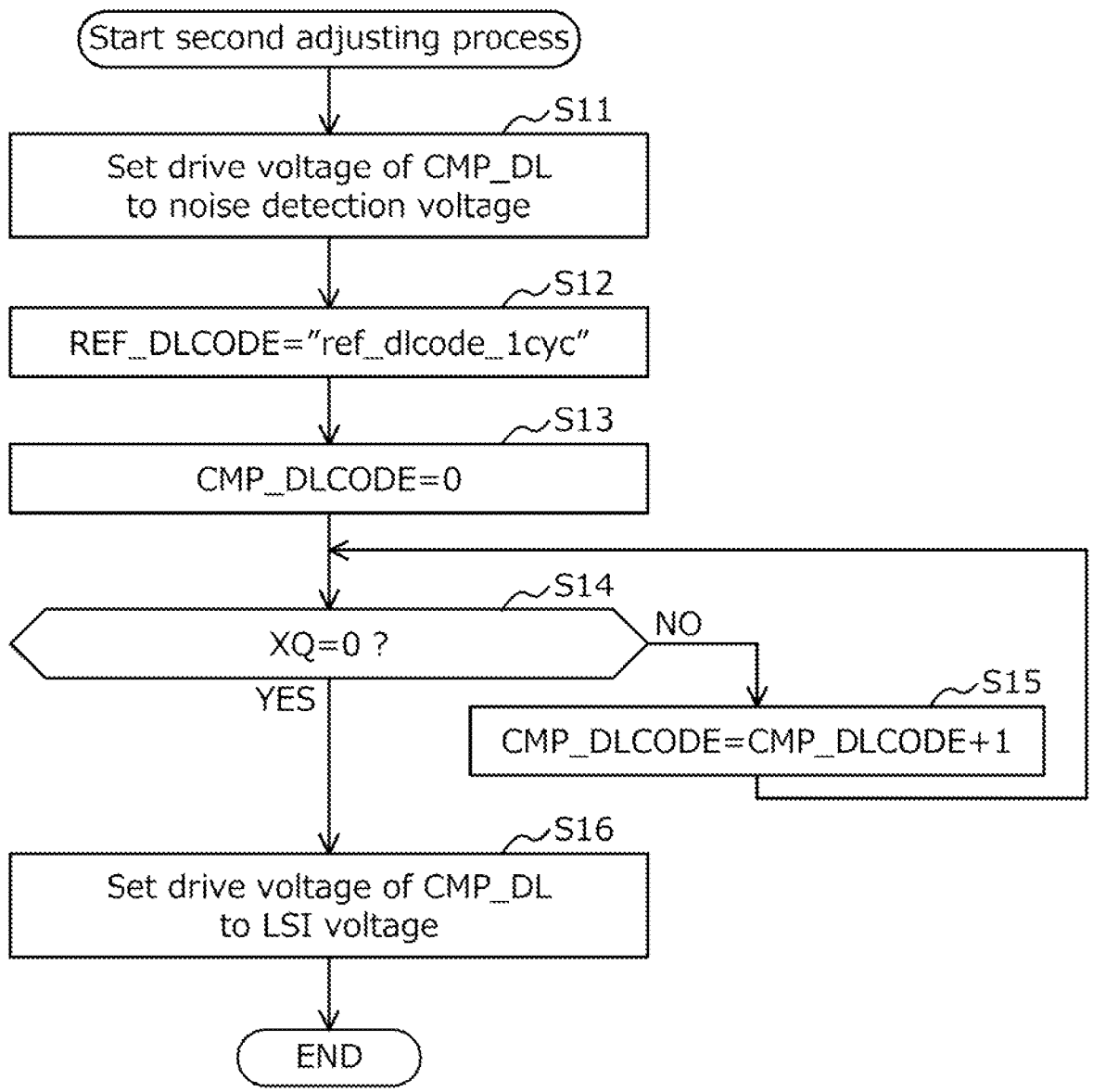
FIG. 9 is a flow diagram for explaining an example of the operation of a second adjusting unit of the one embodiment.

Next, description will now be made in relation to an example of the operation of the calibration process performed by the calibration circuit 6 in the LSI 1 of the one embodiment. FIG. 8 is a flow diagram for explaining an example of the operation of the first adjusting unit 61 of the one embodiment; and FIG. 9 is a flow diagram for explaining an example of the operation of the second adjusting unit 62 of the one embodiment.

(C-1) One Example of First Adjusting Sequence

Hereinafter, description will now be made in relation to an example of an operation of the first adjusting unit 61 of the calibration circuit 6 of the one embodiment with reference to FIG. 8.

In Step S1, the first adjusting unit 61 send a PowerDown signal to the DL 42 (denoted by "CMP DL") and turns off the DL 42.

In Step S2, the first adjusting unit 61 sets the DL delay adjustment code (denoted by "REF_DLCODE") to be outputted to the DL 41 to the initial value "0".

In Step S3, the first adjusting unit 61 determines whether or not the value of XQ corresponding to the output (RESET) of the DL 41, which operates according to the set REF_DL-CODE, is "0".

If XQ=0 is not satisfied (NO in Step S3), the process proceeds to Step S4, or if XQ=0 is satisfied (YES in Step S3), the process proceeds to step S5.

In Step S4, the first adjusting unit 61 adds "1" to the REF_DLCODE and executes the process of Step S3.

In Step S5, the first adjusting unit 61 adds "1" to the REF_DLCODE and executes the process of Step S6.

In Step S6, the first adjusting unit 61 determines whether or not the value of the XQ is "1".

If XQ=1 is not satisfied (NO in Step S6), the process proceeds to Step S5, or if XQ=1 is satisfied (YES in Step S6), the process proceeds to Step S7.

In Step S7, the first adjusting unit 61 specifies the result of subtracting a margin (denoted by "MARGIN") from the REF_DLCODE to be a DL delay adjustment code to be sent in the DL 41.

In Step S8, the first adjusting unit 61 turns on the DL 42 by stopping the sending of the PowerDown signal to the DL 42 (i.e., cancelling PowerDown), and the process ends.

(C-2) One Example of Second Adjusting Sequence

Next, description will now be made in relation to an example of operation of the second adjusting unit 62 of the calibration circuit 6 of the one embodiment with reference to FIG. 9.

In Step S11, the second adjusting unit 62 of the calibration circuit 6 sets the drive voltage of the DL 42 to the noise detection voltage.

In Step S12, the second adjusting unit 62 sets the DL delay adjustment code (denoted by "ref_dlcode_1cyc") specified in the first adjusting sequence in the REF_DL-CODE.

In Step S13, the second adjusting unit 62 sets the DL delay adjustment code (denoted by "CMP_DLCODE") of the DL 42 to the initial value "0". Steps S12 and S13 may be performed in the reverse order. If the REF_DLCODE has been applied to DL41 at the time of Step S7 in FIG. 8, the process of Step S12 may be omitted.

In Step 14, the second adjusting unit 62 determines whether the value of the XQ is "0".

If XQ=0 is not satisfied (NO in Step S14), the process proceeds to Step S15, or if XQ=0 is satisfied (YES in Step S14), the process proceeds to Step S16.

In Step S15, the second adjusting unit 62 adds "1" to the CMP_DLCODE and executes the process of Step S14.

In Step S16, the second adjusting unit 62 sets the drive voltage of the DL 42 to the LSI voltage, and the process ends. The second adjusting unit 62 specifies the CMP_DL-CODE at the time when the determination in Step S14 results in YES as the DL delay adjustment code to be set to the DL 42.

(D) Miscellaneous

The technique according to the above embodiment can be changed and modified as follows.

For example, the first adjusting unit 61 and the second adjusting unit 62 included in the calibration circuit 6 illustrated in FIG. 6 may be merged or may each be divided. Further, the circuit configuration of each of the noise detection circuit 4 and the clock selection circuit 5 is not limited to the configuration illustrated in FIG. 6, and may be combined in any combination, may be divided, or may be replaced with another circuit configuration having the same function.

In addition, although the first adjusting unit 61 and the second adjusting unit 62 increase the DL delay adjustment codes from "0" in the first adjusting sequence and the second adjusting sequence, respectively, the present invention is not limited to this. Alternatively, in at least one of the first adjusting sequence and the second adjusting sequence, the first adjusting unit 61 and the second adjusting unit 62 may reduce the DL delay adjustment code from the maximal value thereof and specify the DL delay adjustment code when the amount of delay falls within one clock cycle.

In one aspect, the one embodiment can shorten a delay time from detection of occurrence of a power supply noise to lowering of the clock frequency in an integrated circuit.

Throughout the descriptions, the indefinite article "a" or "an", or adjective "one" does not exclude a plurality.

All examples and conditional language recited herein are intended for the pedagogical purposes of aiding the reader in understanding the invention and the concepts contributed by the inventor to further the art, and are not to be construed limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A clock frequency adjusting circuit comprising:
   a detection circuit that outputs a detection signal indicative of whether a noise occurs in electric power inputted into an integrated circuit operating in synchronization with a clock signal; and
   a clock frequency controlling circuit that outputs a first clock signal having a first clock frequency to the integrated circuit, and outputs, when the detection signal inputted from the detection circuit indicates occurrence of the noise, a second clock signal having a second clock frequency lower than the first clock frequency to the integrated circuit in place of the first clock signal, the detection circuit comprising
- a first delay circuit that outputs a first delayed clock signal obtained by delaying the first clock signal according to an operation voltage of the integrated circuit,
- a second delay circuit that outputs a second delayed clock signal obtained by delaying the first clock signal according to a threshold voltage lower than the operation voltage, and
- a detection signal output circuit that outputs the detection signal based on a result of comparing a phase of the first delayed clock signal inputted from the first delay circuit and a phase of the second delayed clock signal inputted from the second delay circuit, the detection signal output circuit comprising
- a comparison circuit that outputs the result of the comparing based on whether a rising timing of the first delayed clock signal is earlier than a rising timing of the second delayed clock signal, and
- an output circuit that outputs the result of the comparing at a timing synchronized with the first clock signal.

2. The clock frequency adjusting circuit according to claim 1, further comprising an adjustment circuit that adjusts respective amounts of delays in the first delay circuit and the second delay circuit such that the delays by which the first clock signal are delayed in the first delay circuit and the second delay circuit according to the threshold voltage come to be within a clock cycle of the first clock frequency.

3. The clock frequency adjusting circuit according to claim 2, wherein the adjustment circuit adjusts the respective amounts of the delays in the first delay circuit and the second delay circuit such that the delay by which the first clock signal is delayed according to the threshold voltage is maximized in the clock cycle of the first clock frequency.

4. The clock frequency adjusting circuit according to claim 2, wherein the adjustment circuit
- stores, in a storing region, the amounts of delays of the first delay circuit and the second delay circuit for each combination of the threshold voltage and the first clock frequency, and
- reads, from the storing region, amounts of delays associated with a combination of a threshold voltage corresponding to an operation voltage of the integrated circuit and the first clock frequency in response to a change at least one of the operation voltage of the integrated circuit and the first clock frequency and sets the read amounts of the delays in the first delay circuit and the second delay circuit.

5. A method of adjusting a clock frequency in a clock frequency adjusting circuit comprising a detection circuit and a clock frequency controlling circuit, the method comprising:

at the detection circuit
outputting, from a first delay circuit, a first delayed clock signal obtained by delaying a first clock signal according to an operation voltage of an integrated circuit operating in synchronization with a clock signal, the first clock signal being inputted from the clock frequency controlling circuit and having a first clock frequency, outputting, from a second delay circuit, a second delayed clock signal obtained by delaying the first clock signal according to a threshold voltage lower than the operation voltage, outputting, based on a result of comparing a phase of the first delayed clock signal inputted from the first delay circuit and a phase of the second delayed clock signal inputted from the second delay circuit, a detection signal indicative of whether a noise occurs in electric power inputted into the integrated circuit from a detection signal output circuit, at the clock frequency controlling circuit
outputting the first clock signal to the integrated circuit,
outputting, when the detection signal inputted from the detection circuit indicates occurrence of the noise, a second clock signal having a second clock frequency lower than the first clock frequency to the integrated circuit in place of the first clock signal, at the detection signal output circuit
outputting the result of the comparing based on whether a rising timing of the first delayed clock signal is earlier than a rising timing of the second delayed clock signal from a comparison circuit, and
outputting the result of the comparing from an output circuit at a timing synchronized with the first clock signal.

6. The method according to claim 5, further comprising
at an adjustment circuit included in the clock frequency adjusting circuit
adjusting respective amounts of delays in the first delay circuit and the second delay circuit such that the delays by which the first clock signal are delayed in the first delay circuit and the second delay circuit according to the threshold voltage come to be within a clock cycle of the first clock frequency.

7. The method according to claim 6, further comprising
at the adjustment circuit
adjusting the respective amounts of the delays in the first delay circuit and the second delay circuit such that the delay by which the first clock signal is delayed according to the threshold voltage is maximized in the clock cycle of the first clock frequency.

8. The method according to claim 6, further comprising:
at the adjustment circuit
storing, in a storing region, the amounts of delays of the first delay circuit and the second delay circuit for each combination of the threshold voltage and the first clock frequency, and
reading, from the storing region, amounts of delays associated with a combination of a threshold voltage corresponding to an operation voltage of the integrated circuit and the first clock frequency in response to a change at least one of the operation voltage of the integrated circuit and the first clock frequency and setting the read amounts of the delays in the first delay circuit and the second delay circuit.

* * * * *